US010674615B2

(12) United States Patent
Kurahashi

(10) Patent No.: US 10,674,615 B2
(45) Date of Patent: Jun. 2, 2020

(54) METHOD FOR MANUFACTURING WIRING BOARD

(71) Applicant: IBIDEN CO., LTD., Ogaki (JP)

(72) Inventor: Naoki Kurahashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 401 days.

(21) Appl. No.: 15/609,435

(22) Filed: May 31, 2017

(65) Prior Publication Data

US 2017/0354044 A1 Dec. 7, 2017

(30) Foreign Application Priority Data

Jun. 2, 2016 (JP) ................................ 2016-110711

(51) Int. Cl.
| H05K 3/46 | (2006.01) |
| H05K 1/02 | (2006.01) |
| H05K 3/28 | (2006.01) |
| H05K 3/40 | (2006.01) |
| H05K 3/10 | (2006.01) |
| H05K 3/00 | (2006.01) |
| H05K 3/42 | (2006.01) |

(52) U.S. Cl.
CPC ......... *H05K 3/4655* (2013.01); *H05K 1/0216* (2013.01); *H05K 1/0298* (2013.01); *H05K 3/282* (2013.01); *H05K 3/4038* (2013.01); *H05K 3/0047* (2013.01); *H05K 3/108* (2013.01); *H05K 3/421* (2013.01); *H05K 2201/0191* (2013.01); *H05K 2201/0195* (2013.01); *H05K 2201/0355* (2013.01); *H05K 2203/107* (2013.01); *Y10T 29/49155* (2015.01)

(58) Field of Classification Search
CPC .... H05K 3/4655; H05K 3/282; H05K 3/4038; H05K 3/0047; H05K 3/108; H05K 2201/0191; H05K 2201/0195; H05K 2201/0355; H05K 2203/107; H05K 1/0216; H05K 1/0298
USPC ........................ 29/846, 832, 829, 825, 592.1
See application file for complete search history.

(56) References Cited

FOREIGN PATENT DOCUMENTS

JP 2010-010183 A 1/2010

*Primary Examiner* — Peter Dungba Vo
*Assistant Examiner* — Azm A Parvez
(74) *Attorney, Agent, or Firm* — Oblon, McClelland, Maier & Neustadt, L.L.P.

(57) ABSTRACT

A method for manufacturing a wiring board includes preparing a core substrate having first and second surfaces, forming a first build-up structure including interlayer insulating layers and conductor layers on the first surface of the substrate, and forming a second build-up structure including interlayer insulating layers and one or more conductor layers on the second surface of the substrate. The forming of the first structure includes laminating the insulating layers and metal layers on first surface side of the substrate and forming the conductor layers from all of the metal layers on the first surface side, and the forming of the second structure includes laminating the insulating layers and metal layers on second surface side of the substrate, forming the one or more conductor layers from one or more of the metal layers on the second surface side, and entirely removing the other metal layers on the second surface side.

20 Claims, 15 Drawing Sheets

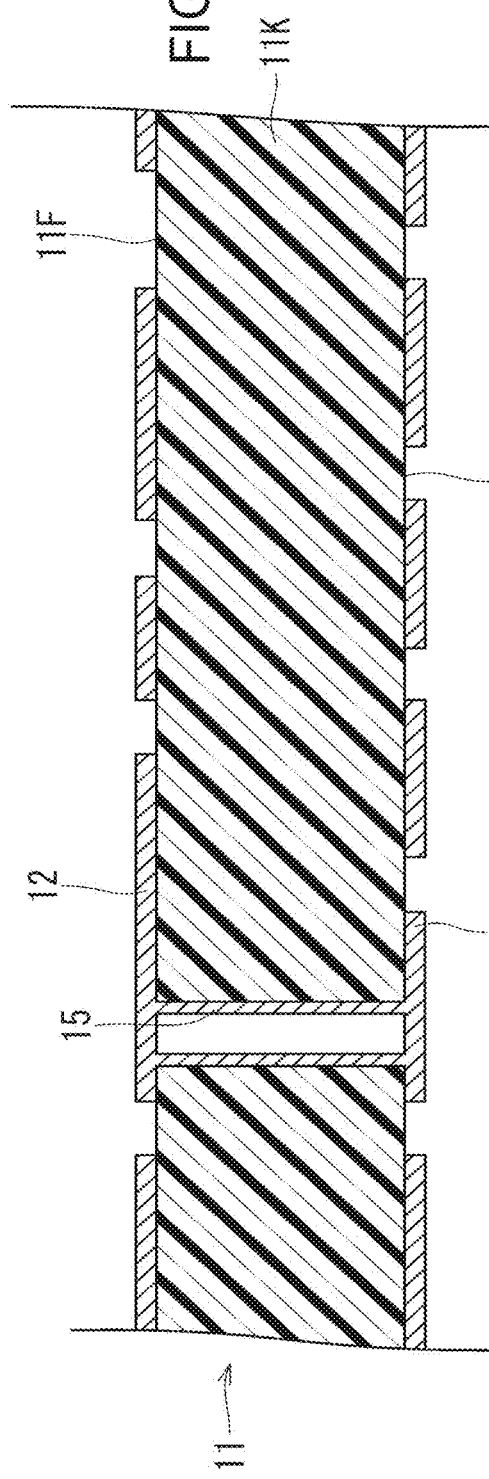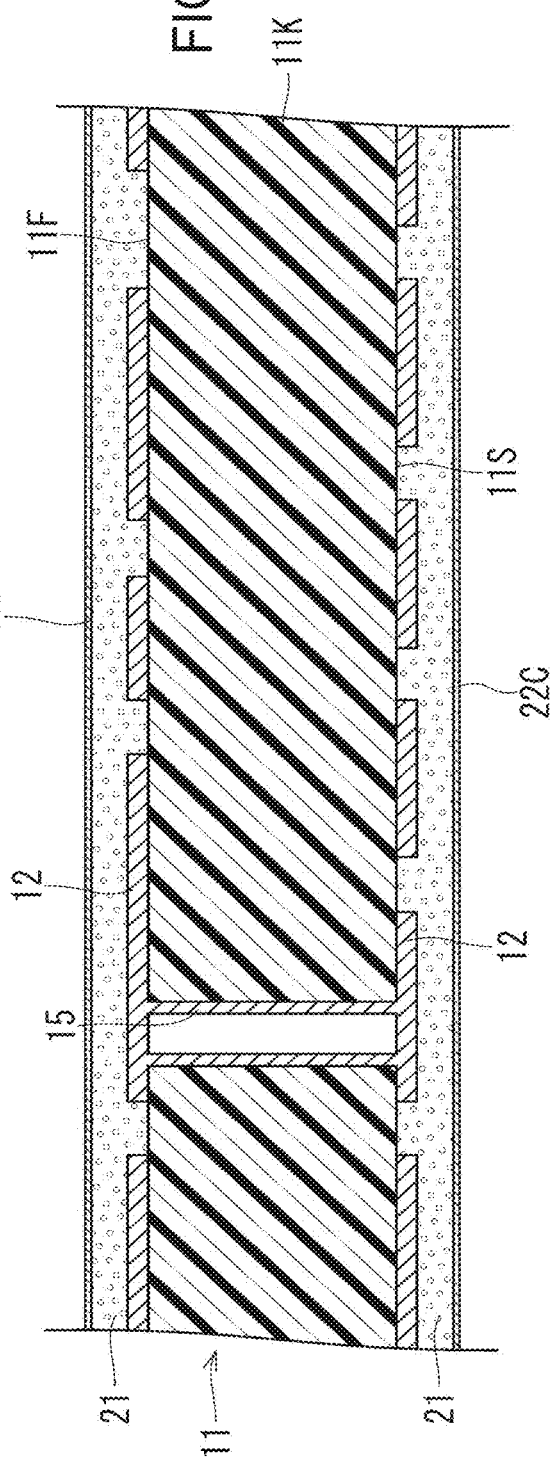

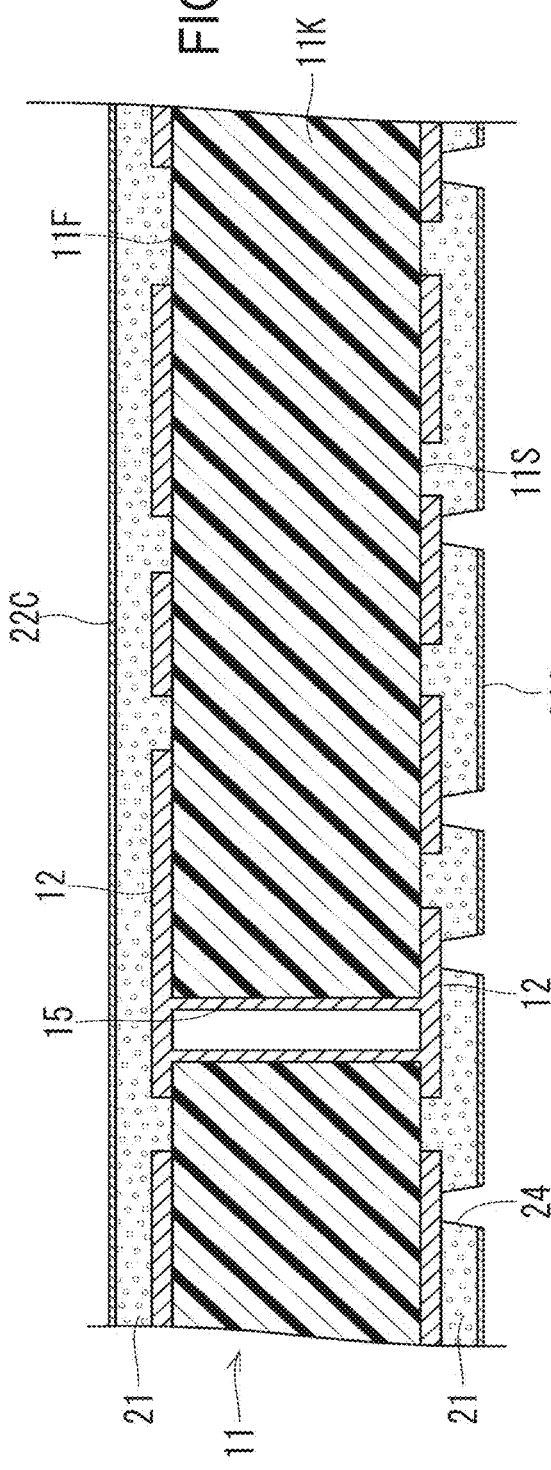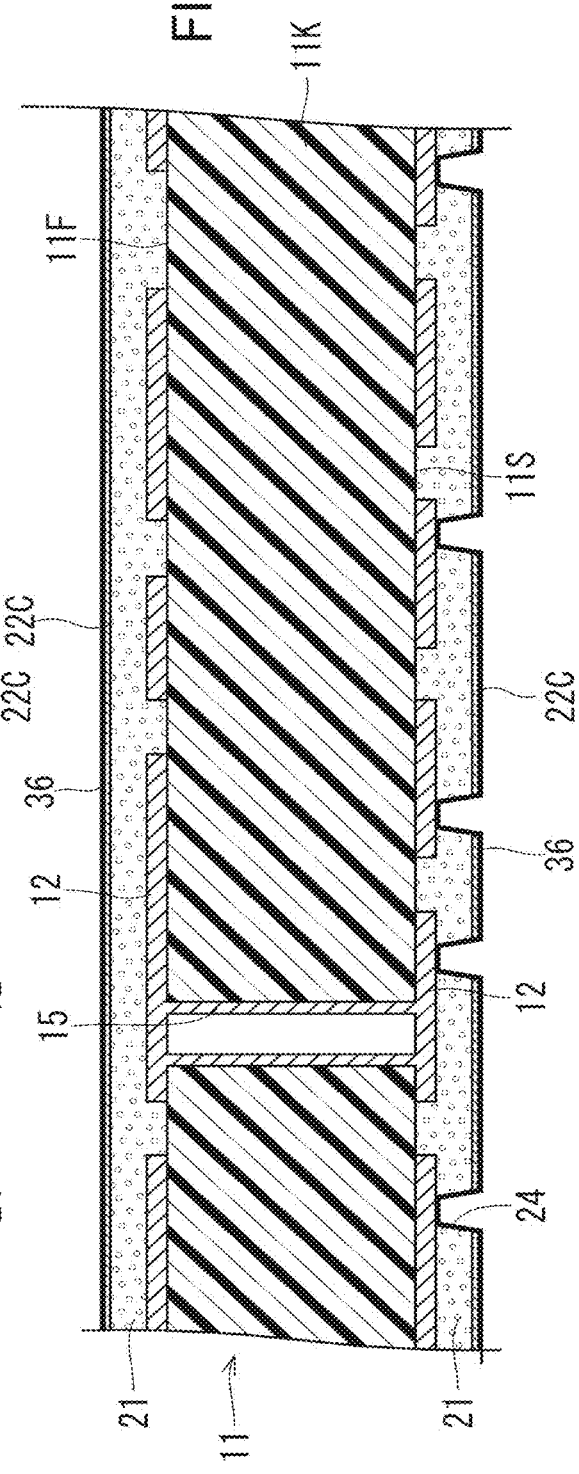

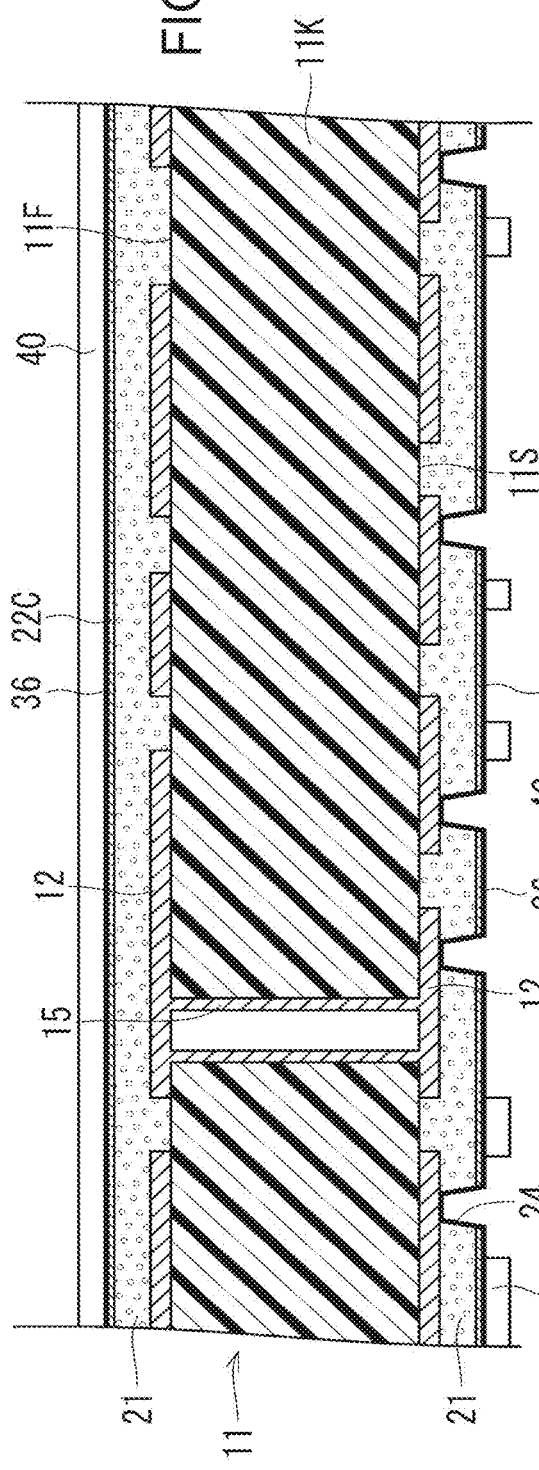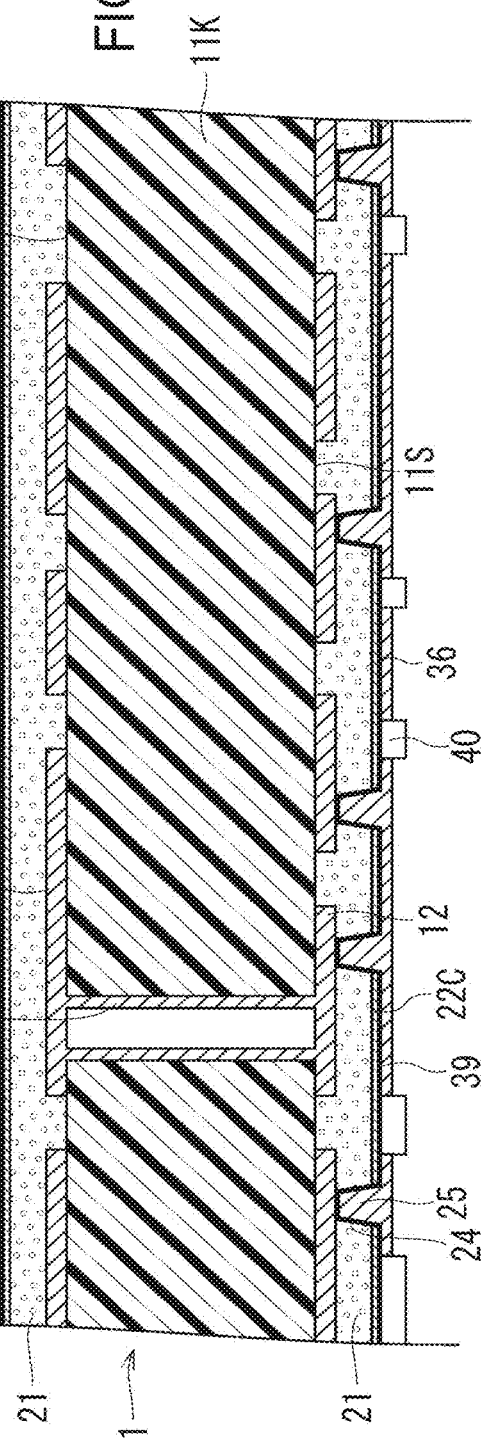

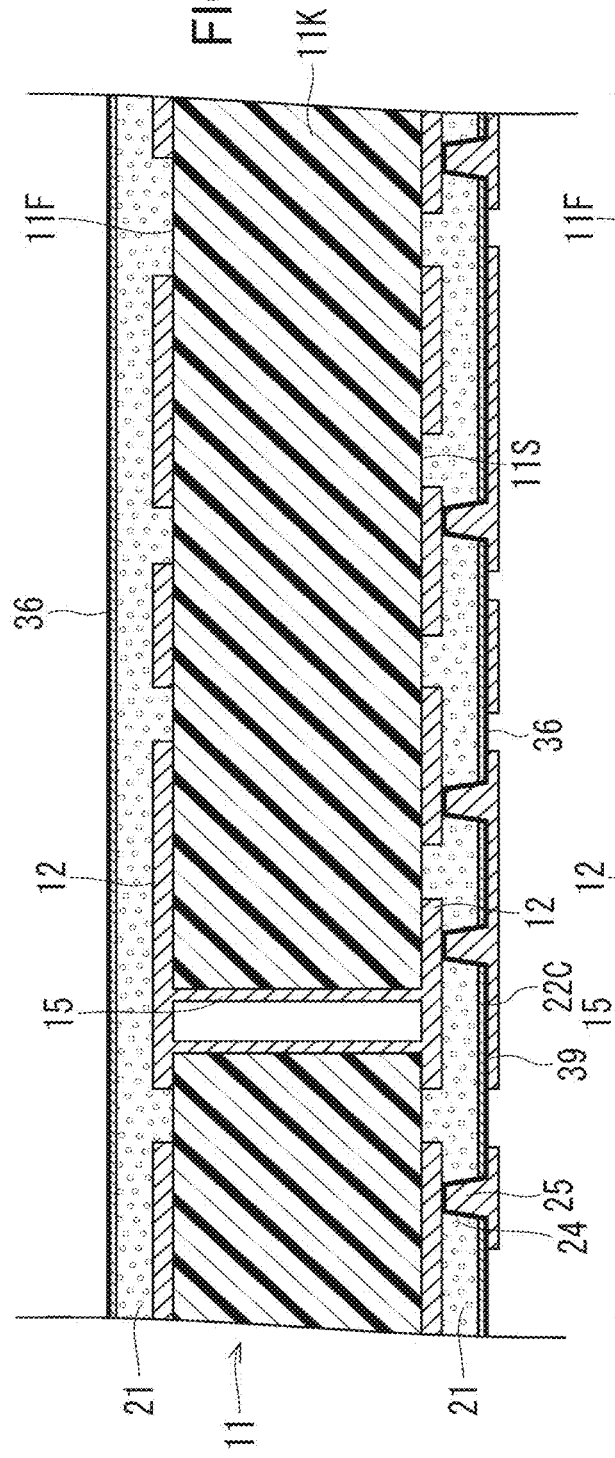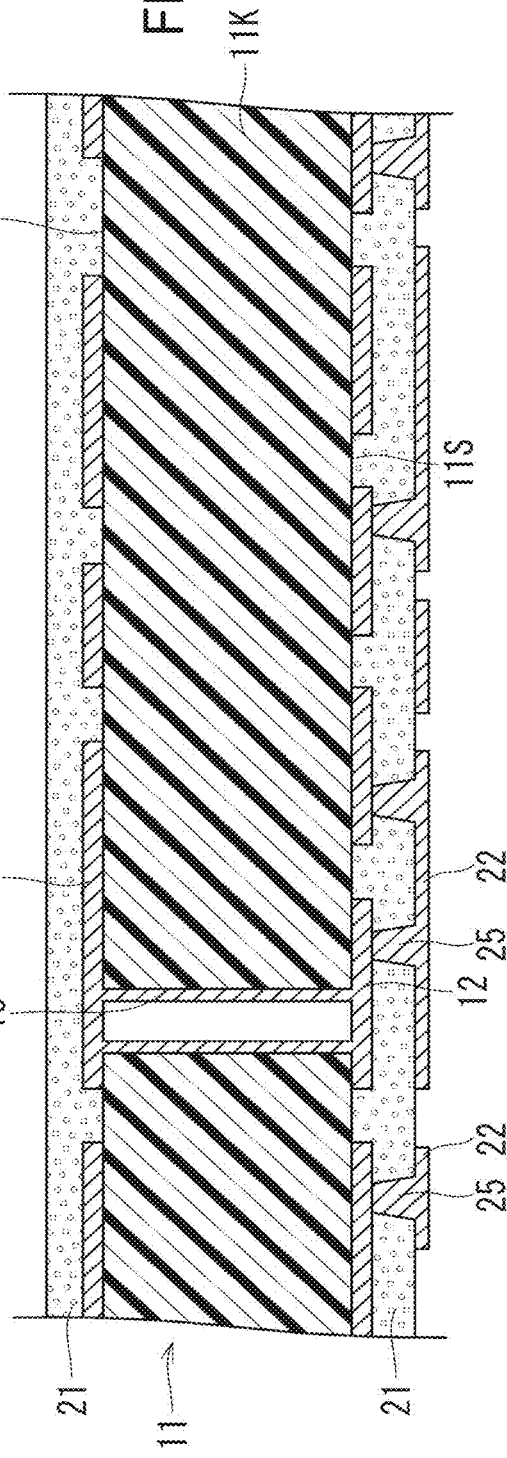

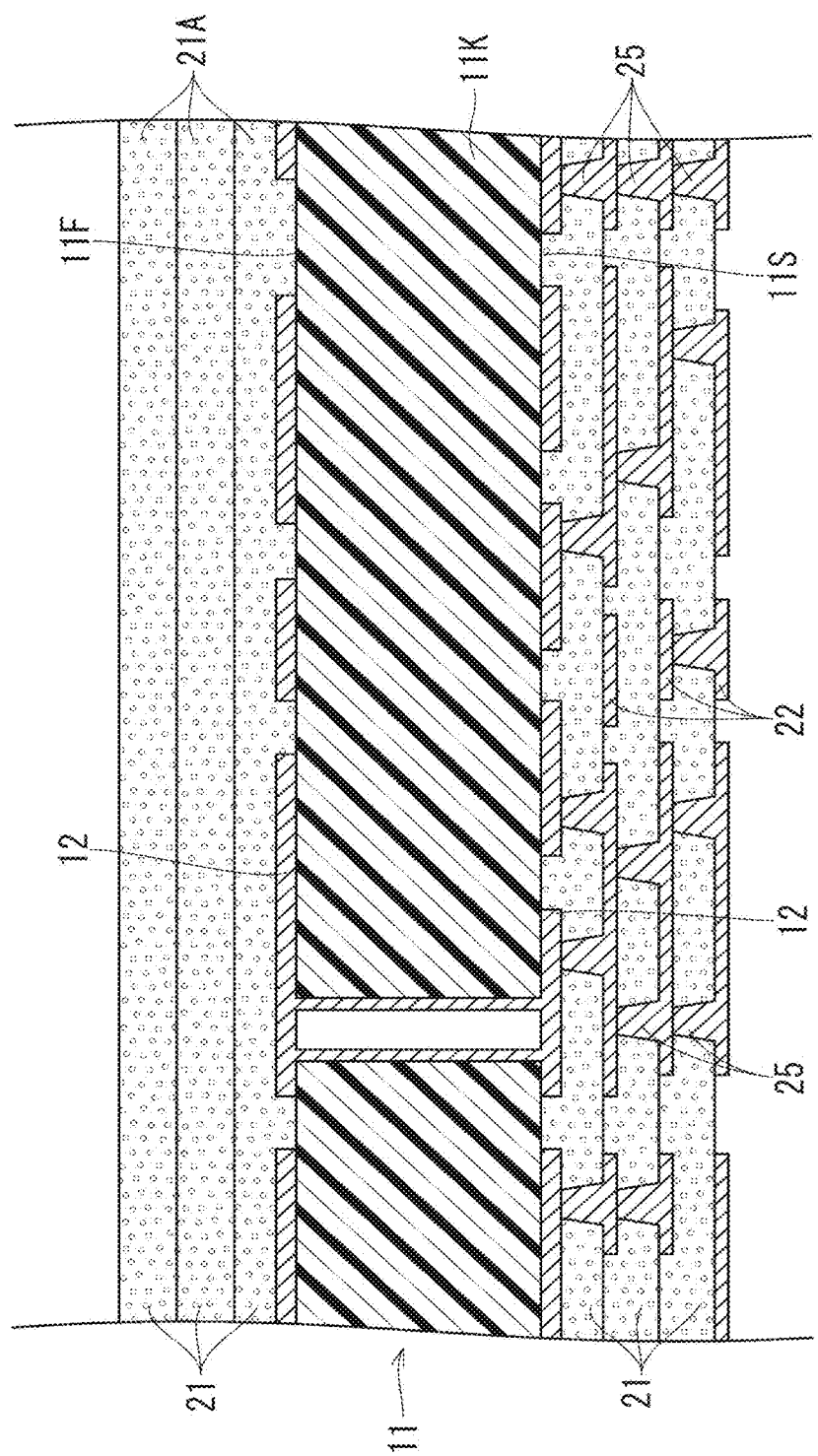

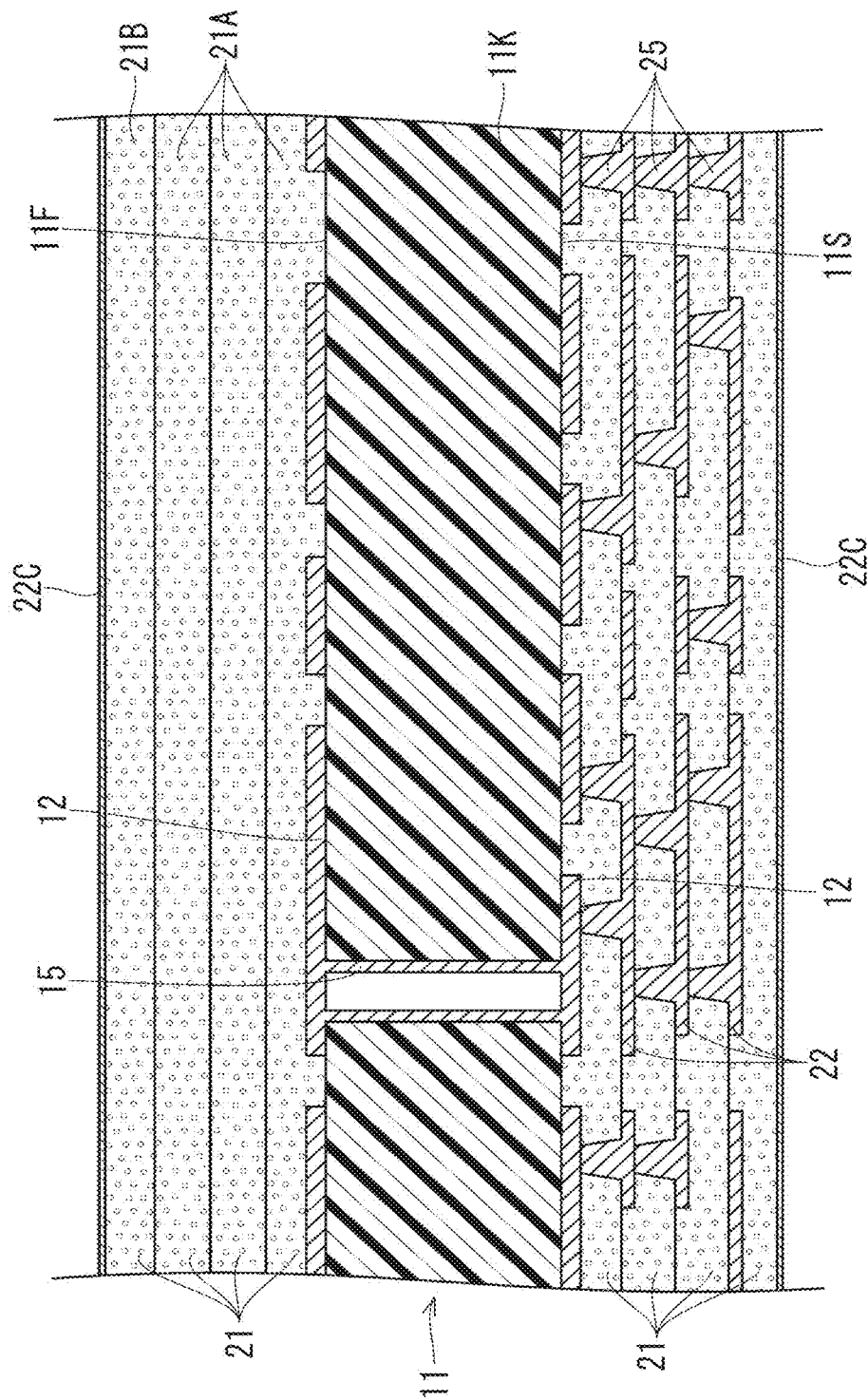

METHOD FOR MANUFACTURING WIRING BOARD

CROSS-REFERENCE TO RELATED APPLICATIONS

The present application is based upon and claims the benefit of priority to Japanese Patent Application No. 2016-110711, filed Jun. 2, 2016, the entire contents of which are incorporated herein by reference.

BACKGROUND OF THE INVENTION

Field of the Invention

The present invention relates to a method for manufacturing a wiring board having asymmetrical structures on a front side and a back side.

Description of Background Art

Japanese Patent Laid-Open Publication No. 2010-10183 describes a wiring board in which numbers of conductor layers laminated on a front side and a back side of an insulating base material are different. The entire contents of this publication are incorporated herein by reference.

SUMMARY OF THE INVENTION

According to one aspect of the present invention, a method for manufacturing a wiring board includes preparing a core substrate having a first surface and a second surface on the opposite side with respect to the first surface, forming a first build-up structure including interlayer insulating layers and conductor layers on the first surface of the core substrate, and forming a second build-up structure including interlayer insulating layers and one or more conductor layers on the second surface of the core substrate. The forming of the first build-up structure includes laminating the interlayer insulating layers and metal layers on a first surface side of the core substrate and forming the conductor layers from all of the metal layers on the first surface side respectively, and the forming of the second build-up structure includes laminating the interlayer insulating layers and metal layers on a second surface side of the core substrate, forming the one or more conductor layers from one or more of the metal layers on the second surface side, and entirely removing the other metal layers on the second surface side.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B are cross-sectional views illustrating manufacturing processes of the wiring board;

FIGS. 3A and 3B are cross-sectional views illustrating manufacturing processes of the wiring board;

FIGS. 4A and 4B are cross-sectional views illustrating manufacturing processes of the wiring board;

FIGS. 5A and 5B are cross-sectional views illustrating manufacturing processes of the wiring board;

FIG. 6 is a cross-sectional view illustrating a manufacturing process of the wiring board;

FIG. 7 is a cross-sectional view illustrating a manufacturing process of the wiring board;

DETAILED DESCRIPTION OF THE EMBODIMENTS

Figure 1:
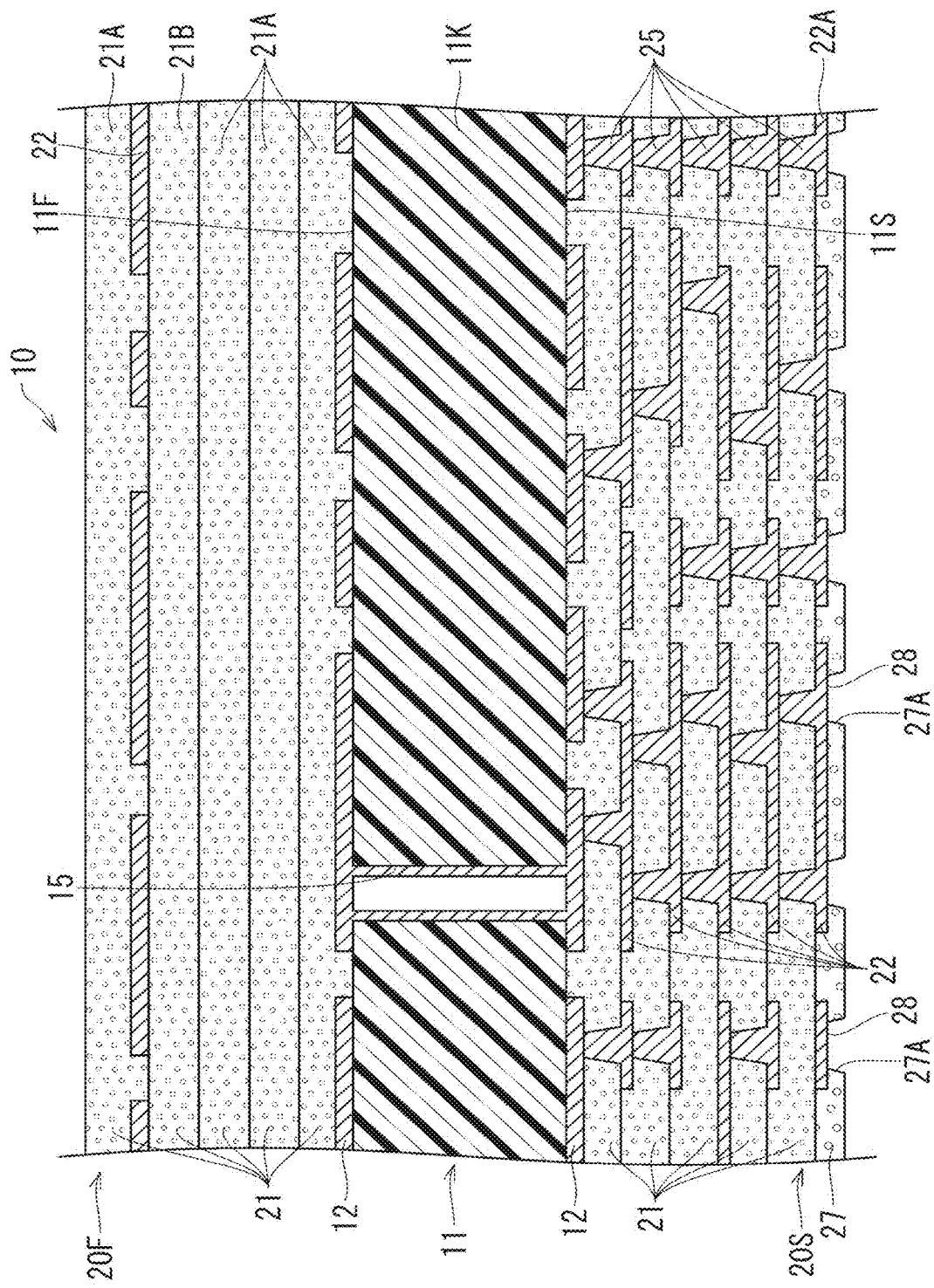
FIG. 1 is a cross-sectional view of a wiring board.

The embodiments will now be described with reference to the accompanying drawings, wherein like reference numerals designate corresponding or identical elements throughout the various drawings.

In the following, the present embodiment is described with reference to FIG. 1-13. As illustrated in FIG. 1, a wiring board 10 of the present embodiment has a structure in which build-up parts (20F, 20S) are respectively provided on an F surface (11F), which is a front side surface of a core substrate 11, and an S surface (11S), which is a back side surface of the core substrate 11. In the following, the build-up part (20F) on the F surface (11F) and the build-up part (20S) on the S surface (11S) are appropriately distinguished by being respectively referred to as an F surface side build-up part (20F) and an S surface side build-up part (20S).

The core substrate 11 has a structure in which conductor layers 12 are respectively laminated on a front side and a back side of an insulating base material (11K). The front side conductor layer 12 and the back side conductor layer 12 are connected to each other by a through-hole conductor 15 that penetrates the insulating base material (11K).

The S surface side build-up part (20S) is formed by alternately laminating multiple interlayer insulating layers 21 and multiple conductor layers 22. Via conductors 25 are formed in the interlayer insulating layers 21. Due to the via conductors 25, adjacent conductor layers (22, 22) are connected to each other, and the conductor layer 22 on an innermost side (that is, on a side closest to the core substrate 11) and the back side conductor layer 12 of the core substrate 11 are connected to each other. The interlayer insulating layers 21 are each formed of a low dielectric constant material (for example, a material having a dielectric loss tangent (Df) of 0.005 or less). The number of the interlayer insulating layers 21 and the number of the conductor layers 22 in the S surface side build-up part (20S) are the same.

The F surface side build-up part (20F) is formed from multiple interlayer insulating layers 21 and one conductor layer 22. That is, in the wiring board 10, the build-up part (20F) on the F surface (11F) and the build-up part (20S) on the S surface (11S) have mutually asymmetrical structures. Similar to the interlayer insulating layers 21 that form the S surface side build-up part (20S), the interlayer insulating layers 21 that form the F surface side build-up part (20F) are also each formed of a low dielectric constant material (for example, a material having a dielectric loss tangent (Df) of 0.005 or less). In the present embodiment according to the present invention, the S surface (11S) of the core substrate 11 forms a "first surface", and the F surface (11F) of the core substrate 11 forms a "second surface."

The multiple interlayer insulating layers 21 included in the F surface side build-up part (20F) include first interlayer insulating layers (21A) (on an upper surface of each of which the conductor layer 22 is not laminated) and a second interlayer insulating layer (21B) (on an upper surface of which the conductor layer 22 is laminated). In the F surface side build-up part (20F) of the present embodiment, on the F surface (11F) of the core substrate 11, multiple first interlayer insulating layers (21A) are successively laminated; on the multiple first interlayer insulating layers (21A), the one second interlayer insulating layer (21B) is laminated; and on the conductor layer 22 of the second interlayer insulating layer (21B), one first interlayer insulating layer (21A) is laminated.

A solder resist layer 27 is laminated on the S surface side build-up part (20S). In the solder resist layer 27, openings (27A) are formed that respectively expose portions of an outermost conductor layer (22A) that is farthest from core substrate 11 among the conductor layers in the S surface side build-up part (20S), and pads 28 are formed by the portions of the outermost conductor layer (22A) that are respectively exposed by the openings (27A).

The wiring board 10 of the present embodiment is manufactured as follows.

(1) As illustrated in FIG. 2A, the core substrate 11 is prepared. In the core substrate 11, the conductor layers 12 are respectively laminated on the front side and the back side of the insulating base material (11K), and the through-hole conductor 15 that connects the front side conductor layer 12 and the back side conductor layer 12 is formed in the insulating base material (11K). The insulating base material (11K) is formed of an epoxy resin or a BT (bismaleimide triazine) resin and a glass cloth.

(2) As illustrated in FIG. 2B, a prepreg (a resin sheet of a B-stage formed by impregnating a core material with a resin containing an inorganic filler) as an interlayer insulating layer 21 containing an inorganic filler and a copper foil (22C) (corresponding to a "metal layer" according to an embodiment of the present invention) are laminated on the conductor layer 12 on the F surface (11F) of the core substrate 11, and a prepreg as an interlayer insulating layer 21 and a copper foil (22C) (corresponding to a "metal layer" according to an embodiment of the present invention) are laminated on the conductor layer 12 on the S surface (11S) side of the core substrate 11, and the resulting substrate is hot-pressed. In doing so, spaces between portions of the conductor layer 12 on the F surface (11F side of the core substrate 11 are filled with the prepreg, and, similarly, spaces between portions of the conductor layer 12 on the S surface (11S) side of the core substrate 11 are filled with the prepreg. As an interlayer insulating layer 21, instead of a prepreg, it is also possible that a resin film that does not contain a core material but contains inorganic filler is used. In this case, without laminating a copper foil, a conductor layer 12 can be directly formed on a surface of the resin film using a semi-additive method. In this case, an electroless plating film formed on the interlayer insulating layer 21 by an electroless plating treatment to be described later becomes a "metal layer" according to an embodiment of the present invention.

(3) As illustrated in FIG. 3A, by irradiating CO2 laser to the copper foil (22C) on the S surface (11S) side of the core substrate 11, tapered via holes 24 that penetrate the copper foil (22C) and the interlayer insulating layer 21 are formed. Then, insides of the via holes 24 are cleaned (subjected to a desmear treatment) using an oxidation agent such as permanganate.

(4) As illustrated in FIG. 3B, an electroless plating treatment is performed, and an electroless plating film 36 is formed on the copper foil (22C) on the F surface (11F) side, on the copper foil (22C) on the S surface (11S) side, and on inner surfaces of the via holes 24 on the S surface (11S) side.

(5) As illustrated in FIG. 4A, on the electroless plating film 36 on the F surface (11F) side, a plating resist 40 covering the entire electroless plating film 36 is formed, and a plating resist 40 of a predetermined pattern is formed on the electroless plating film 36 on the S surface (11S) side.

(6) An electrolytic plating treatment is performed. As illustrated in FIG. 4B, the via conductors 25 are formed by filling the via holes 24 with electrolytic plating, and an electrolytic plating film 39 is formed on portions of the electroless plating film 36 on the S surface (11S) side of the core substrate 11 that are exposed from the plating resist 40.

(7) The plating resists 40 are removed using 5% NaOH (see FIG. 5A). Further, the electroless plating films 36 and the copper foils (22C) below the plating resists 40 are removed. Then, a conductor layer 22 is formed on the S surface (11S) side of the core substrate 11 by the remaining electrolytic plating film 39, electroless plating film 36 and copper foil (22C) (see FIG. 5B). In this case, the electroless plating film 36 and the copper foil (22C) on the F surface (11F) side are entirely removed. Further, the conductor layer 12 and the conductor layer 22 on the S surface (11S) side are connected by the via conductors 25.

(8) The above-described processes (2)-(7) are repeated, and, as illustrated in FIG. 6, the multiple interlayer insulating layers 21 are laminated on the F surface (11F) of the core substrate 11, and the multiple interlayer insulating layers 21 and the multiple conductor layers 22 are alternately laminated on the S surface (11S) of the core substrate 11. In FIG. 6, the multiple interlayer insulating layers 21 laminated on the F surface (11F) respectively form the first interlayer insulating layers (21A) arranged below the second interlayer insulating layer (21B) in the F surface side build-up part (20F).

(9) In the same manner as the above-described process (2), an interlayer insulating layer 21 and a copper foil (22C) are laminated on each of the F surface (11F) side and the S surface (11S) side of the core substrate 11, and the resulting substrate is hot-pressed (see FIG. 7). In FIG. 7, the interlayer insulating layer 21 laminated on the multiple first interlayer insulating layers (21A) forms the second interlayer insulating layer (21B) of the F surface side build-up part (20F).

Figure 8:
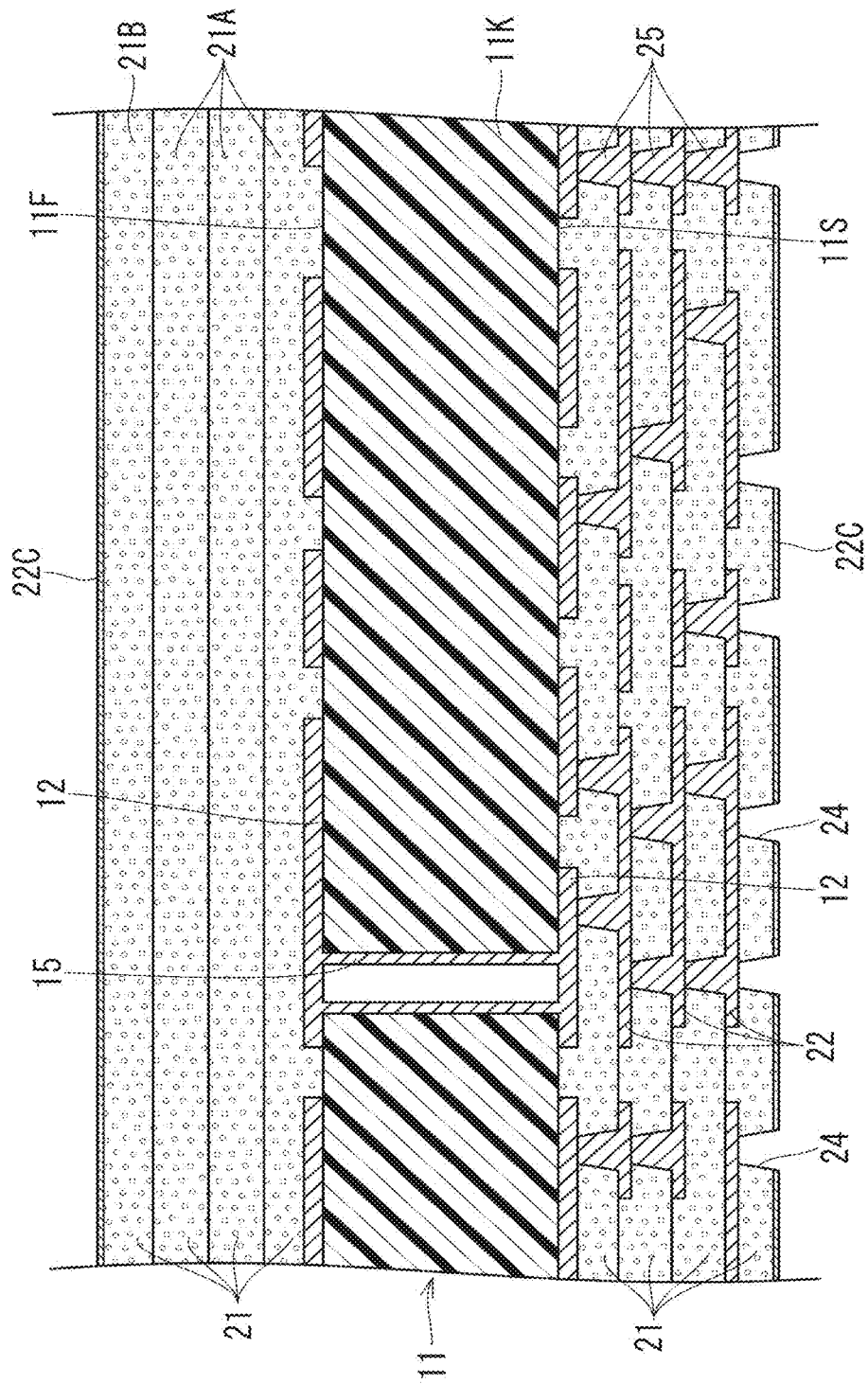
FIG. 8 is a cross-sectional view illustrating a manufacturing process of the wiring board.
Figure 9:
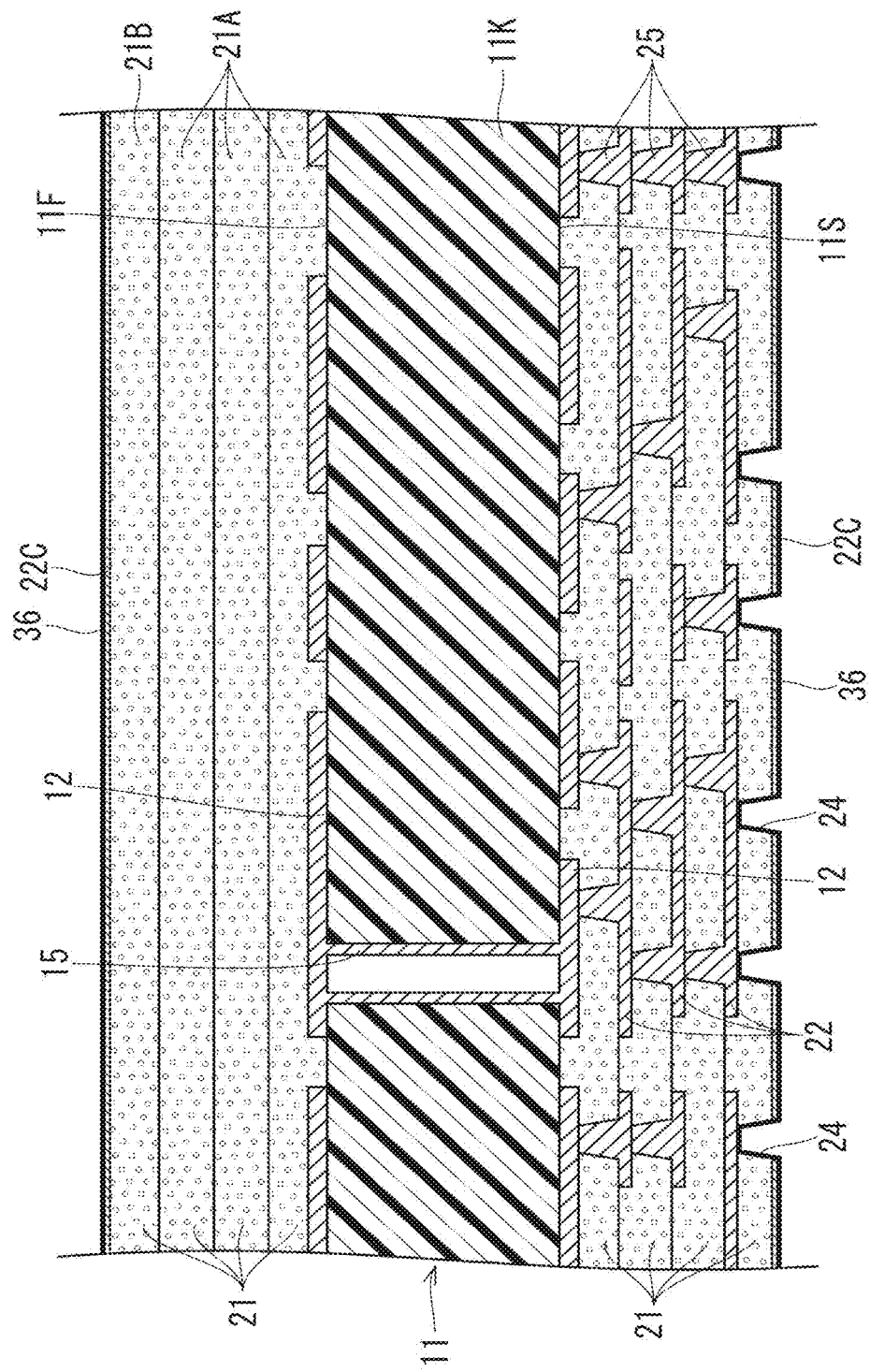
FIG. 9 is a cross-sectional view illustrating a manufacturing process of the wiring board.

(10) In the same manner as the above-described process (3), by irradiating CO2 laser to the copper foil (22C) on the S surface (11S) side of the core substrate 11, tapered via holes 24 that penetrate the copper foil (22C) and the interlayer insulating layer 21 are formed (see FIG. 8). Then, insides of the via holes 24 are cleaned (subjected to a desmear treatment) using an oxidation agent such as permanganate.

(11) In the same manner as the above-described process (4), an electroless plating treatment is performed, and an electroless plating film 36 is formed on the copper foil (22C) on the F surface (11F) side, on the copper foil (22C) on the S surface (11S) side, and on inner surfaces of the via holes 24 on the S surface (11S) side.

Figure 10:
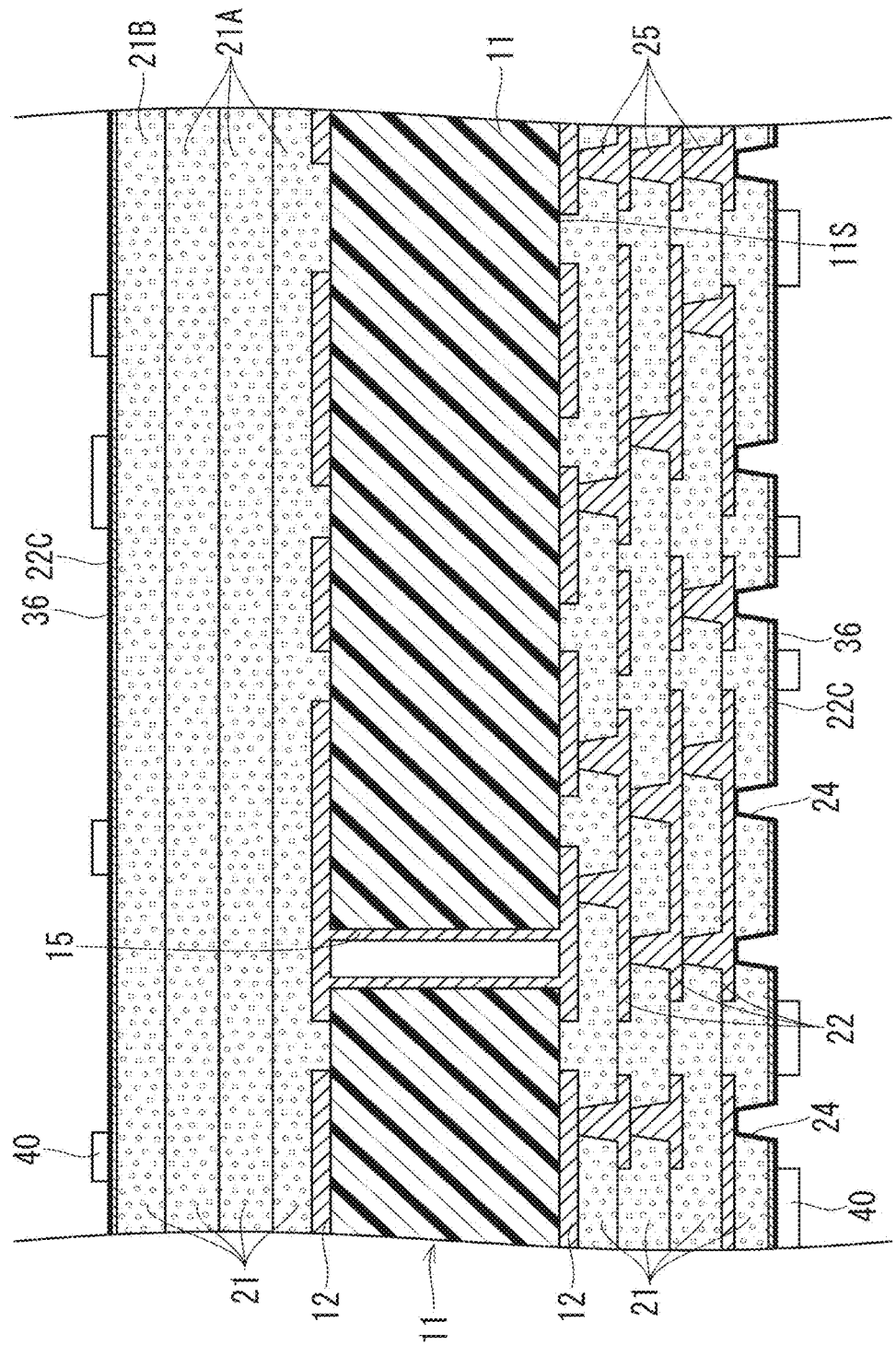
FIG. 10 is a cross-sectional view illustrating a manufacturing process of the wiring board.
Figure 11:
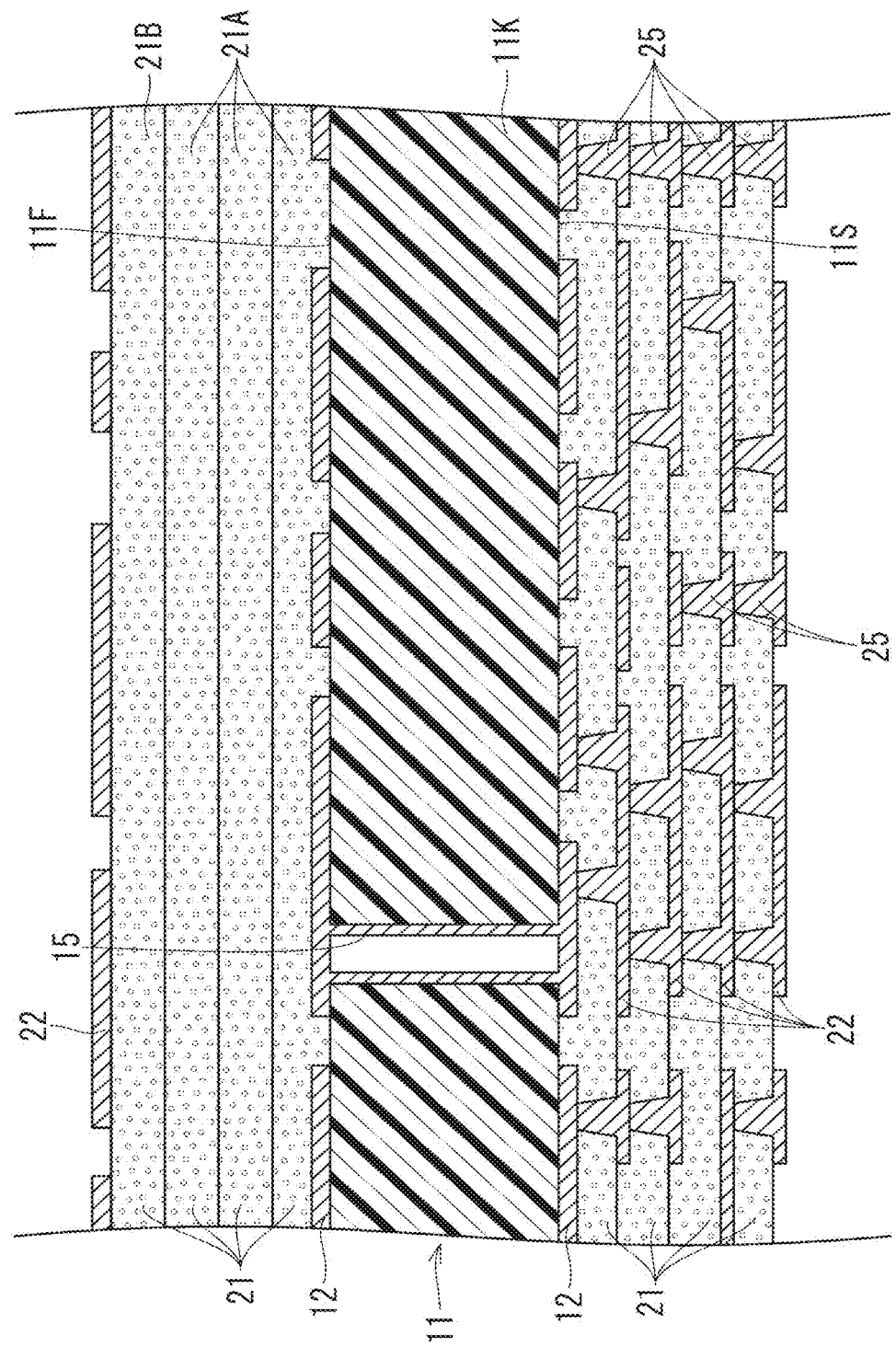
FIG. 11 is a cross-sectional view illustrating a manufacturing process of the wiring board.

(12) In the same manner as the above-described process (5), plating resists 40 of predetermined patterns are respectively formed on the electroless plating films 36, 36 of the F surface (11F) side and the S surface (11S) side (see FIG. 10).

(13) In the same manner as the above-described process (6), an electrolytic plating treatment is performed. The via conductors 25 are formed by filling the via holes 24 with electrolytic plating, and an electrolytic plating film (not illustrated in the drawings) is formed on portions of the electroless plating films (36, 36) on the F surface (11F) side and the S surface (11S) side of the core substrate 11 that are exposed from the plating resists 40.

(14) In the same manner as the above-described process (7), the plating resists 40 are removed, and the electroless plating films 36 and the copper foils (22C) below the plating resists 40 are removed. Then, conductor layers 22 are respectively formed on the F surface (11F) side and the S surface (11S) side of the core substrate 11 by the remaining electrolytic plating films, electroless plating films 36 and copper foils (22C) (see FIG. 11). The conductor layer 22 on the F surface (11F) side is formed on the second interlayer insulating layer (21B).

Figure 12:
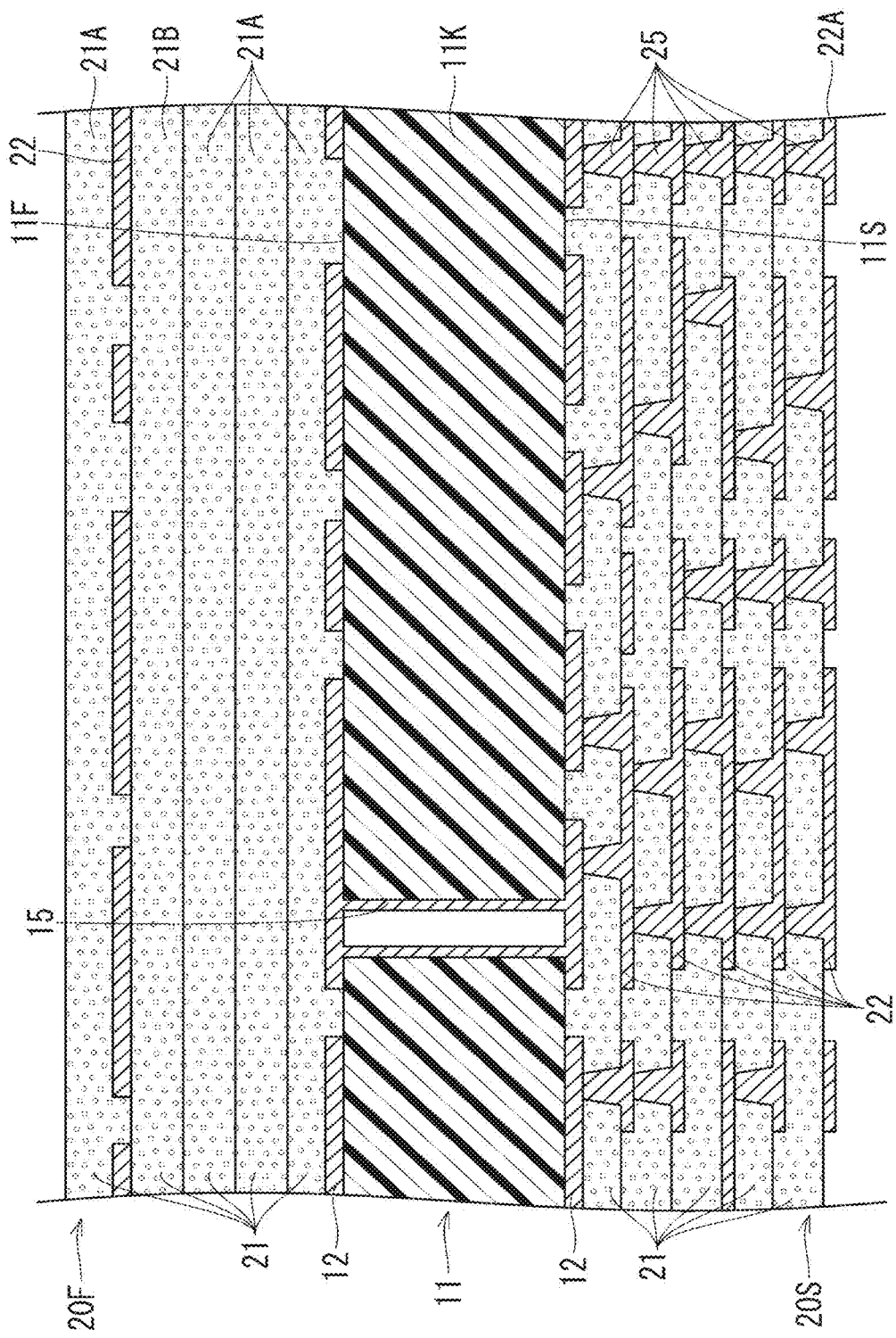
FIG. 12 is a cross-sectional view illustrating a manufacturing process of the wiring board.

(15) The above-described processes (2)-(7) are repeated, and, as illustrated in FIG. 12, the interlayer insulating layer 21 is laminated on the F surface (11F) side of the core substrate 11, and the interlayer insulating layer 21 and the conductor layer 22 are laminated on the S surface (11S) side of the core substrate 11. In this case, on the F surface (11F) side, the electroless plating film 36 and the copper foil (22C) are entirely removed; and on the S surface (11S) side, the conductor layer 22 is formed from the electrolytic plating film, the electroless plating film 36 and the copper foil (22C). In FIG. 12, the interlayer insulating layer 21 formed on the conductor layer 22 on the F surface (11F) side forms a first interlayer insulating layer (21A) of the F surface side build-up part (20F).

Figure 13:
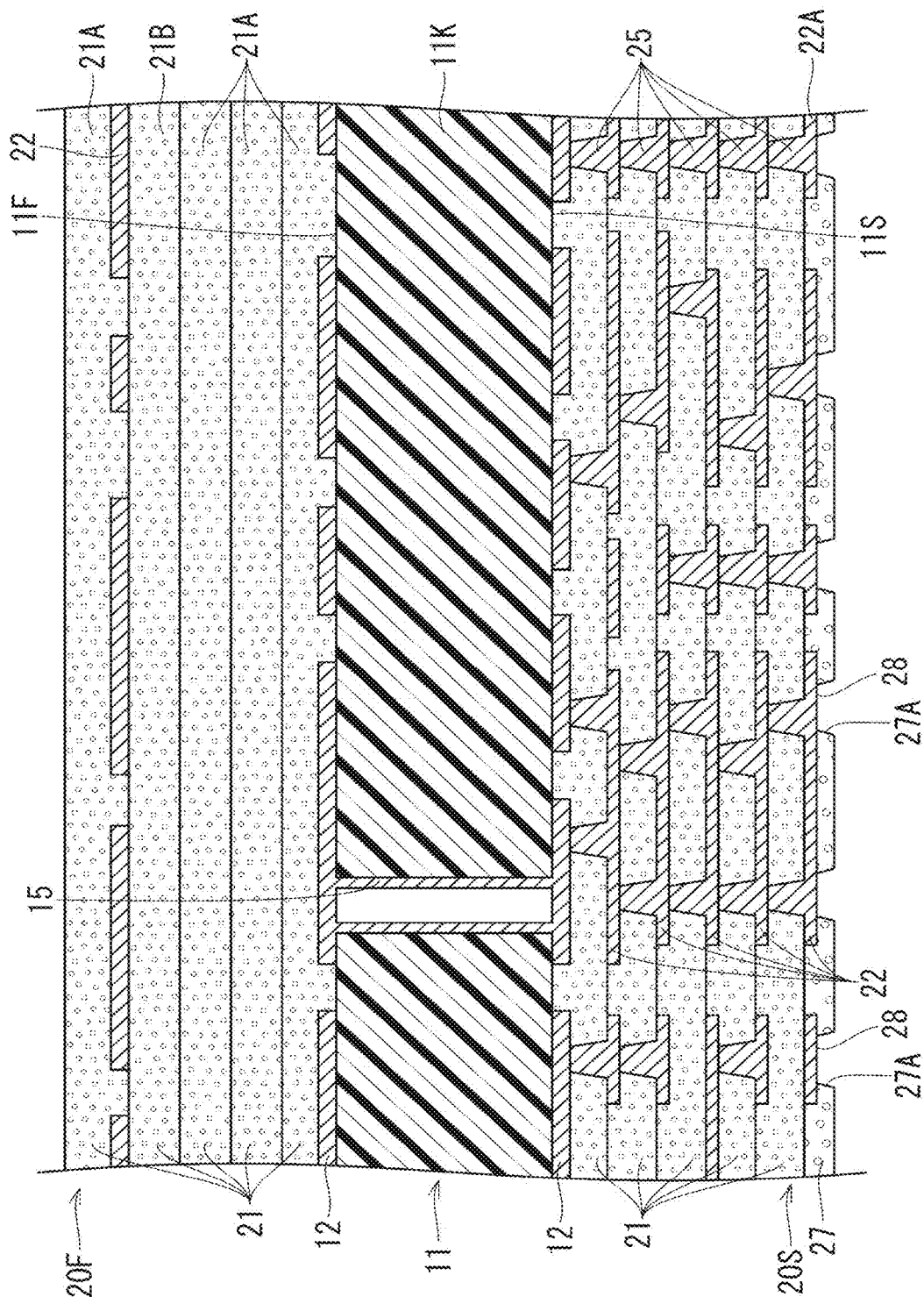
FIG. 13 is a cross-sectional view illustrating a manufacturing process of the wiring board.

(16) As illustrated in FIG. 13, the solder resist layer 27 is laminated on the S surface (11S) side of the core substrate 11. Next, the S surface (11S) side is subjected to a photoresist treatment. The openings (27A) are formed in the solder resist layer 27, and the pads 28 are formed on the outermost conductor layer (22A) on the S surface (11S) side. As a result, the wiring board 10 illustrated in FIG. 1 is completed.

The description about the method for manufacturing the wiring substrate 10 of the present embodiment is as given above. Next, an operation effect of the method for manufacturing the wiring board 10 is described.

In the method for manufacturing the wiring board 10 of the present embodiment, multiple interlayer insulating layers 21 are laminated on each of the F surface (11F) and the S surface (11S) of the core substrate 11, and a conductor layer 22 is formed from a copper foil 22 laminated on each of the interlayer insulating layers 21. On the S surface (11S) side, the conductor layers 22 are respectively formed from all the copper foils (22C), whereas on the F surface (11F) side, the conductor layer 22 is formed from one copper foil (22C), and the other copper foils (22C) are entirely removed. According to the manufacturing method of the present embodiment, even when the build-up parts (20F, 20S) that are respectively laminated on the F surface (11F) and the S surface (11S) of the core substrate 11 has mutually asymmetrical structures, the wiring board 10 may be manufactured using a technology of a build-up method in which multiple interlayer insulating layers 21 and multiple conductor layers 22 are alternately laminated on each of the F surface (11F) and the S surface (11S).

Further, in the method for manufacturing the wiring board 10 of the present embodiment, the copper foils (22C) that are respectively laminated on the multiple first interlayer insulating layers (21A) that are successively laminated in a lamination direction on the F surface (11F) side of the core substrate 11 are entirely removed, and the conductor layer 22 is formed from the copper foil (22C) laminated on the second interlayer insulating layer (21B) that is arranged on the multiple first interlayer insulating layers (21A). Therefore, below the conductor layer 22 laminated on the F surface (11F) side, at least two or more first interlayer insulating layers (21A) are successively arranged in the lamination direction. According to the method for manufacturing the wiring board 10 of the present embodiment, noise propagation to the core substrate 11 on the F surface (11F) side can be suppressed. Further, in the present embodiment, all copper foils (22C) arranged above the copper foil (22C) on the second interlayer insulating layer (21B) are entirely removed. Therefore, the conductor layer 22 on the second interlayer insulating layer (21B) can be electrically isolated, and the noise propagation suppression effect can be enhanced. Further, in the present embodiment, in the multiple first interlayer insulating layers (21A) arranged below the conductor layer 22 on the F surface (11F) side, via conductors 25 connected to the conductor layer 22 are not formed. Therefore, propagation of noise received by the conductor layer 22 to the core substrate 11 through via conductors 25 is suppressed.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

Figure 14:
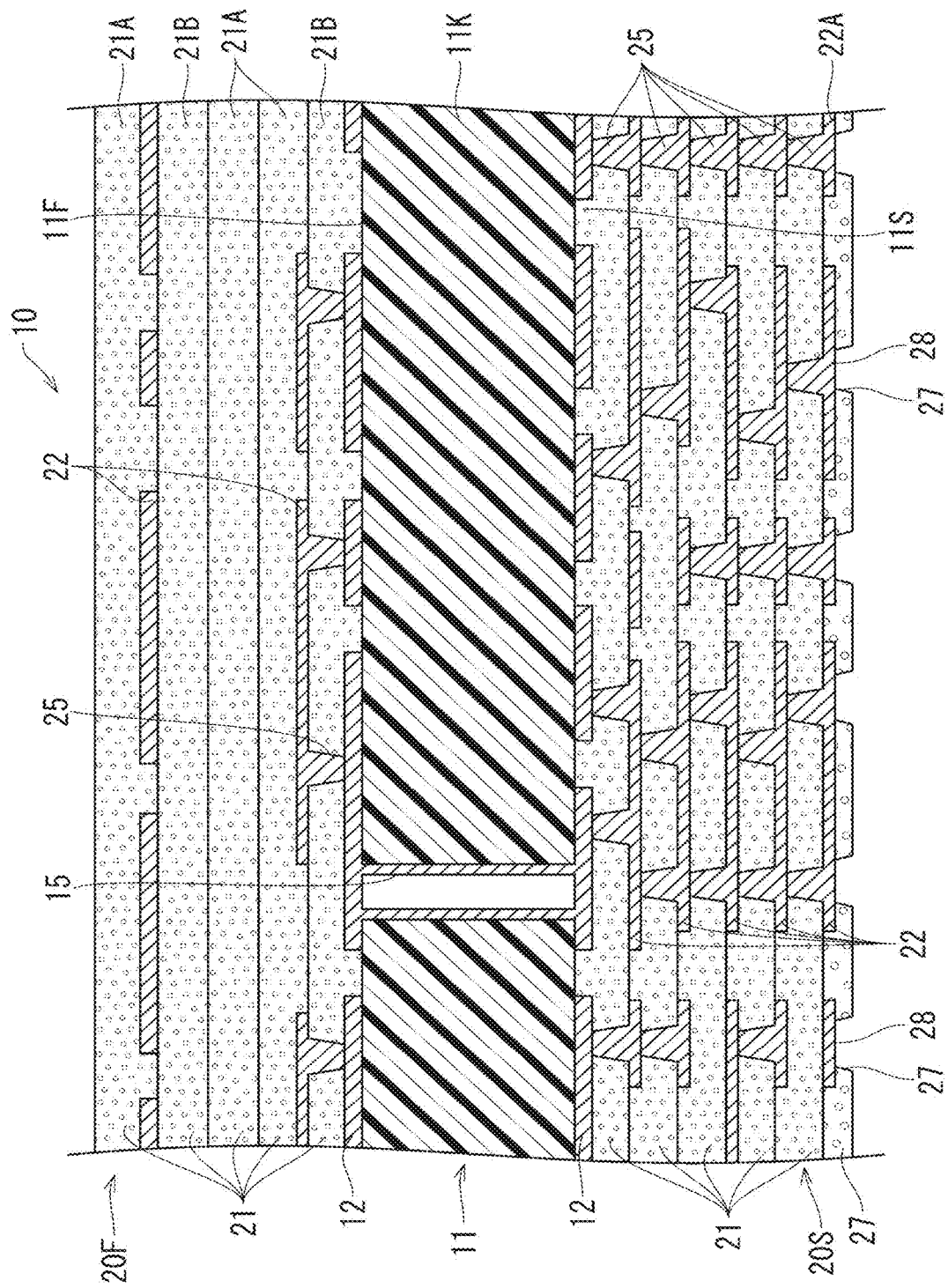
FIG. 14 is cross-sectional view of a wiring board according to another embodiment.
Figure 15:
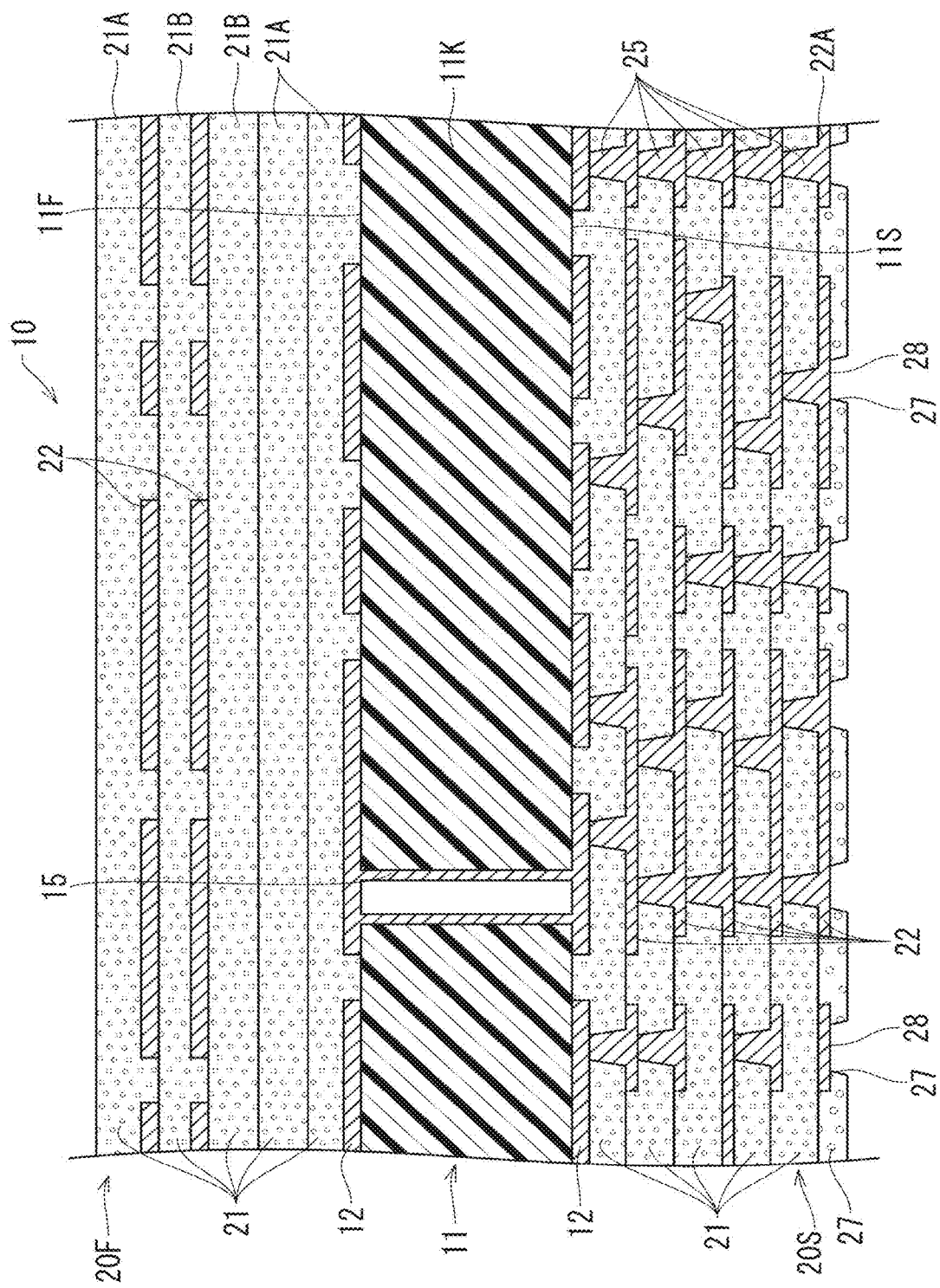
FIG. 15 is cross-sectional view of a wiring board according to yet another embodiment.

(1) As FIGS. 14 and 15, it is also possible that multiple conductor layers 22 are included in the F surface side build-up part (20F). In the example illustrated in FIG. 14, in the F surface side build-up part (20F), two conductor layers 22 are included, and two or more first interlayer insulating layers (21A) are sandwiched between the two conductor layers 22. Specifically, a second interlayer insulating layer (21B) is laminated on the F surface (11F) of the core substrate 11, and a lower side (side closer to the core substrate 11) conductor layer 22 is laminated on the second interlayer insulating layer (21B). On the lower side conductor layer 22, multiple first interlayer insulating layers (21A) and a second interlayer insulating layer (21B) are laminated in this order, and an upper side conductor layer 22 is laminated on the second interlayer insulating layer (21B). On the upper side conductor layer 22, a first interlayer insulating layer (21A) is laminated. In the second interlayer insulating layer (21B) laminated on the F surface (11F), via conductors 25 connecting the conductor layer 12 of the core substrate 11 and the lower side conductor layer 22 are formed.

Further, in the example illustrated in FIG. 15, in the F surface side build-up part (20F), two conductor layers 22 are included, and two or more first interlayer insulating layers (21A) are sandwiched between a lower side conductor layer 22 and the core substrate 11. Specifically, on the F surface (11F) of the core substrate 11, multiple first interlayer insulating layers (21A) and a second interlayer insulating layer (21B) are laminated in this order, and a lower side conductor layer 22 is laminated on the second interlayer insulating layer (21B). On the lower side conductor layer 22, a second interlayer insulating layer (21B) is laminated, and an upper side conductor layer 22 is laminated on the second interlayer insulating layer (21B). On the upper side conductor layer 22, a first interlayer insulating layer (21A) is laminated. Via conductors 25 connecting the two conductor layers (22, 22) are not formed in the second interlayer insulating layer (21B) sandwiched between the upper side conductor layer 22 and the lower side conductor layer 22.

(2) In the above embodiments, the examples are illustrated in which the number of the multiple first interlayer insulating layers (21A) sandwiched between the second interlayer insulating layer (21B) and the core substrate 11 is 3. However, it is also possible that the number of the multiple first interlayer insulating layers (21A) sandwiched between the second interlayer insulating layer (21B) and the core substrate 11 is 2 or 4 or more.

When a wiring board has an asymmetrical structure, there may be a problem that manufacture is difficult.

A method for manufacturing a wiring board according to an embodiment of the present invention allows a wiring board having asymmetrical structures on a front side and a back side to be easily manufactured.

A method for manufacturing a wiring board according to one aspect of the present invention includes: preparing a core substrate having a first surface and a second surface respectively on a front side and a back side; laminating multiple interlayer insulating layers on each of the first surface and the second surface of the core substrate; laminating a metal layer on each of the interlayer insulating layers; forming conductor layers on the first surface side respectively from all the multiple metal layers on the first surface side; and forming conductor layers on the second surface side respectively from some of the multiple metal layers on the second surface side and entirely removing the other remaining metal layers on the second surface side.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a wiring board, comprising:
preparing a core substrate having a first surface and a second surface on an opposite side with respect to the first surface;
forming a first build-up structure comprising a plurality of interlayer insulating layers and a plurality of conductor layers on the first surface of the core substrate; and
forming a second build-up structure comprising a plurality of interlayer insulating layers and at least one conductor layer on the second surface of the core substrate,
wherein the forming of the first build-up structure comprises laminating the plurality of interlayer insulating layers and a plurality of metal layers on a first surface side of the core substrate and forming the conductor layers from all of the metal layers on the first surface side respectively, and the forming of the second build-up structure comprises laminating the plurality of interlayer insulating layers and a plurality of metal layers on a second surface side of the core substrate, forming the at least one conductor layer from at least one of the plurality of metal layers on the second surface side, and entirely removing other metal layers on the second surface side.

2. A method for manufacturing a wiring board according to claim 1, wherein the laminating of the interlayer insulating layers and metal layers on the first surface side of the core substrate and the laminating of the interlayer insulating layers and metal layers on the second surface side of the core substrate comprise laminating equals number of the metal layers on the first and second surface sides of the core substrate.

3. A method for manufacturing a wiring board according to claim 1, wherein the laminating of the interlayer insulating layers and metal layers on the first surface side of the core substrate and the laminating of the interlayer insulating layers and metal layers on the second surface side of the core substrate comprise laminating equal numbers of the interlayer insulating layers on the first and second surface sides of the core substrate.

4. A method for manufacturing a wiring board according to claim 1, wherein the laminating of the plurality of interlayer insulating layers and a plurality of metal layers on the second surface side of the core substrate comprises forming a plurality of first interlayer insulating layers successively in a laminating direction, entirely removing a plurality of the metal layers laminated on the first interlayer insulating layers, forming a second interlayer insulating layer on the plurality of first interlayer insulating layers, and forming the at least one conductor layer from the plurality of metal layers laminated on the second interlayer insulating layer.

5. A method for manufacturing a wiring board according to claim 4, wherein the laminating of the plurality of interlayer insulating layers and a plurality of metal layers on the second surface side of the core substrate comprises entirely removing a plurality of the metal layers laminated on a plurality of the interlayer insulating layers on the second interlayer insulating layer in the laminating direction.

6. A method for manufacturing a wiring board according to claim 4, wherein the forming of the first build-up structure comprises forming a plurality of via conductors such that the via conductors connect the conductor layers on the first surface side of the core substrate, and the forming of the second build-up structure comprises forming, in the plurality of first interlayer insulating layers, no via conductors connected to the conductor layer on the second surface side.

7. A method for manufacturing a wiring board according to claim 1, wherein the forming of the first build-up structure comprises forming a solder resist layer on an outermost conductor layer of the conductor layers on the first surface side.

8. A method for manufacturing a wiring board according to claim 1, wherein each of the metal layers in the first build-up structure comprises a metal foil, and each of the metal layers in the second build-up structure comprises a metal foil.

9. A method for manufacturing a wiring board according to claim 2, wherein the laminating of the interlayer insulating layers and metal layers on the first surface side of the core substrate and the laminating of the interlayer insulating layers and metal layers on the second surface side of the core substrate comprise laminating equal numbers of the interlayer insulating layers on the first and second surface sides of the core substrate.

10. A method for manufacturing a wiring board according to claim 2, wherein the laminating of the plurality of interlayer insulating layers and a plurality of metal layers on the second surface side of the core substrate comprises forming a plurality of first interlayer insulating layers successively in a laminating direction, entirely removing a plurality of the metal layers laminated on the first interlayer insulating layers, forming a second interlayer insulating layer on the plurality of first interlayer insulating layers, and forming the at least one conductor layer from the plurality of metal layers laminated on the second interlayer insulating layer.

11. A method for manufacturing a wiring board according to claim 10, wherein the laminating of the plurality of interlayer insulating layers and a plurality of metal layers on the second surface side of the core substrate comprises entirely removing a plurality of the metal layers laminated on a plurality of the interlayer insulating layers on the second interlayer insulating layer in the laminating direction.

12. A method for manufacturing a wiring board according to claim 10, wherein the forming of the first build-up structure comprises forming a plurality of via conductors such that the via conductors connect the conductor layers on the first surface side of the core substrate, and the forming of the second build-up structure comprises forming, in the plurality of first interlayer insulating layers, no via conductors connected to the conductor layer on the second surface side.

13. A method for manufacturing a wiring board according to claim 2, wherein the forming of the first build-up structure comprises forming a solder resist layer on an outermost conductor layer of the conductor layers on the first surface side.

14. A method for manufacturing a wiring board according to claim 2, wherein each of the metal layers in the first build-up structure comprises a metal foil, and each of the metal layers in the second build-up structure comprises a metal foil.

15. A method for manufacturing a wiring board according to claim 5, wherein the forming of the first build-up structure comprises forming a plurality of via conductors such that the via conductors connect the conductor layers on the first surface side of the core substrate, and the forming of the second build-up structure comprises forming, in the plurality of first interlayer insulating layers, no via conductors connected to the conductor layer on the second surface side.

16. A method for manufacturing a wiring board according to claim 11, wherein the forming of the first build-up structure comprises forming a plurality of via conductors such that the via conductors connect the conductor layers on the first surface side of the core substrate, and the forming of the second build-up structure comprises forming, in the plurality of first interlayer insulating layers, no via conductors connected to the conductor layer on the second surface side.

17. A method for manufacturing a wiring board according to claim 3, wherein the laminating of the plurality of interlayer insulating layers and a plurality of metal layers on the second surface side of the core substrate comprises forming a plurality of first interlayer insulating layers successively in a laminating direction, entirely removing a plurality of the metal layers laminated on the first interlayer insulating layers, forming a second interlayer insulating layer on the plurality of first interlayer insulating layers, and forming the at least one conductor layer from the plurality of metal layers laminated on the second interlayer insulating layer.

18. A method for manufacturing a wiring board according to claim 17, wherein the laminating of the plurality of interlayer insulating layers and a plurality of metal layers on the second surface side of the core substrate comprises entirely removing a plurality of the metal layers laminated on a plurality of the interlayer insulating layers on the second interlayer insulating layer in the laminating direction.

19. A method for manufacturing a wiring board according to claim 17, wherein the forming of the first build-up structure comprises forming a plurality of via conductors such that the via conductors connect the conductor layers on the first surface side of the core substrate, and the forming of the second build-up structure comprises forming, in the plurality of first interlayer insulating layers, no via conductors connected to the conductor layer on the second surface side.

20. A method for manufacturing a wiring board according to claim 18, wherein the forming of the first build-up structure comprises forming a plurality of via conductors such that the via conductors connect the conductor layers on the first surface side of the core substrate, and the forming of the second build-up structure comprises forming, in the plurality of first interlayer insulating layers, no via conductors connected to the conductor layer on the second surface side.

* * * * *